United States Patent
Stanzl

(10) Patent No.: US 6,718,629 B1
(45) Date of Patent: Apr. 13, 2004

(54) METHOD AND APPARATUS FOR MOUNTING COMPONENTS ONTO A SUBSTRATE OF AN ELECTRICAL ASSEMBLY

(75) Inventor: Harald Stanzl, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/558,779

(22) Filed: Apr. 26, 2000

(30) Foreign Application Priority Data

Apr. 30, 1999 (DE) .......................... 199 19 915

(51) Int. Cl.[7] .............................................. H05K 3/30
(52) U.S. Cl. .............................. 29/832; 29/593; 29/834
(58) Field of Search .................... 29/832, 834, 593, 29/733, 840, 703, 705, 711, 712, 740, 741, 743, 833; 414/403, 404, 737, 752; 901/40; 294/2, 64.1

(56) References Cited

U.S. PATENT DOCUMENTS

| | | | |
|---|---|---|---|
| 4,512,707 A | * | 4/1985 | Dines et al. ................... 312/42 |
| 4,570,058 A | * | 2/1986 | Havassy ...................... 235/383 |
| 4,598,459 A | * | 7/1986 | Klink et al. ................. 29/564.8 |
| 4,759,123 A | * | 7/1988 | Ohta et al. ................... 209/573 |
| 4,821,198 A | * | 4/1989 | Takeuchi et al. ................ 483/4 |
| 4,888,473 A | * | 12/1989 | Rossi et al. .................. 235/376 |
| 4,941,795 A | * | 7/1990 | Elliott et al. ................. 221/106 |
| 4,951,240 A | * | 8/1990 | Fukino ......................... 716/15 |
| 5,166,884 A | * | 11/1992 | Maney et al. ................. 235/375 |
| 5,456,001 A | * | 10/1995 | Mori et al. .................... 29/739 |
| 5,743,695 A | * | 4/1998 | Ryu ......................... 414/331.01 |

* cited by examiner

Primary Examiner—Allan N. Shoap
Assistant Examiner—Issac Hamilton
(74) Attorney, Agent, or Firm—Harness, Dickey & Pierce, P.L.C.

(57) ABSTRACT

A method and apparatus for mounting a component onto a substrate of an electrical assembly that utilizes a transponder unit. The transponder unit is attached to the substrate for storing mounting process data, such as, the component manufacturer identification code, the number of missing components, and the number of faulty substrate position, before, during or after the mounting process. The stored process data can then be transmitted to a control unit that controls the component mounting apparatus wherein the data is processed and utilized during the mounting operation to enhance process quality control.

15 Claims, 2 Drawing Sheets

METHOD AND APPARATUS FOR MOUNTING COMPONENTS ONTO A SUBSTRATE OF AN ELECTRICAL ASSEMBLY

BACKGROUND OF THE INVENTION

1. Field of the Invention

The invention relates to a method and apparatus for mounting components onto a substrate of an electrical assembly that utilizes a transponder unit for effectively communicating component mounting process information to other data processing units in order to enhance process quality control.

2. Description of the Prior Art

The International Patent Application No. WO 98/37744 discloses an apparatus for manufacturing electrical assemblies wherein the assembly components are automatically mounted onto a substrate at a predetermined position by a component mounting head member of the component mounting unit. In order to determine whether the substrate is properly conditioned to accept the component at the predetermined position, the substrate is generally marked with an ink spot. A number of automatic component mounting units that are arranged in an assembly line fashion for mounting a number of different components onto the substrate can then recognize a faulty substrate during the course of the manufacturing, mounting or equipping process. Thus, each of the successive automatic mounting component units of the assembly line will then no longer act to mount or equip the faulty substrate. In this way, the components will be saved from idle or defective use resulting from being mounted on a faulty substrate surface. However, additional mounting process information cannot presently be utilized to further enhance process quality control.

A transponder or data storage unit is generally known and disclosed in the International Patent Application No. WO 92/22827. The transponder unit is generally known to receive data information, to store this information and to subsequently transmit this information to a data readout unit. The transmission of data from the transponder to the data readout unit generally occurs via radio signal and thus is wirelessly transmitted.

SUMMARY OF THE INVENTION

The utilization of a transponder or data storage unit during the mounting of components onto a substrate of an electrical assembly is not known. It is therefore an object of the present invention to provide a method and apparatus for mounting a variety of different components onto a variety of different electrical assembly substrates that utilize a number of transponder units to store and subsequently transmit detailed component mounting process information, such as, the presence of a faulty substrate position or other like mounting process information. This information is, thus, effectively communicated to other data process units to enhance the component mounting process quality control.

The present invention provides a number of wireless data storage or transponder units that are disposed on the substrates which are to be mounted or equipped with the components. The transponder units store information that is communicated to them from a control mechanism of the automatic component mounting unit. The data or information that is stored in the transponder unit can then be supplemented, erased, retrieved, read or processed in any like manner at arbitrary times during the component mounting sequence. For example, component mounting information, such as, the manufacturer of the mounted or equipped components, the missing components, that is, the components that have not yet been mounted or the inspection results of the automatic component mounting units, can be stored as data to be utilized for investigating or monitoring the number of faulty substrate positions or any like mounting process parameter in order to ensure optimal process quality control.

In an embodiment, the data storage or transponder unit is placed onto the substrate by the automatic component mounting unit in order to enhance the automation of the component mounting process. In a preferred embodiment, the data storage or transponder unit stores information from each of the successive automatic component mounting units that are arranged in an assembly line manner for placing or mounting a variety of different components onto a variety of different substrates at a predetermined substrate position. This information provides an automated and detailed record of the component mounting process that can then be readily utilized to identify, repair or replace faulty component placements or mounts or can then be utilized for other like mounting process quality control measures.

In an embodiment, the stored data of the data storage unit is transmitted to each of the successive component mounting units. As a result, the detailed record of the component mounting process is continually monitored and updated along the entire automated assembly line so that process information, such as, faulty substrate cites, missing components or other like process parameters, can be continually identified by each of the successive component mounting units that are arranged in an assembly line fashion. In this way, the stored process information or data can be utilized by each of the successive automated component mounting units to avoid mounting components onto faulty substrate cites or positions, to provide missing components or to provide other like mounting process operations.

In an embodiment, a detailed record of the component mounting process is preferably achieved when the substrate is divided into substrate regions wherein a wireless data storage or transponder unit is disposed on each of the substrate regions. As a result, faulty substrate cites or other like process parameters can be more precisely monitored.

In an embodiment, an entire batch of faulty manufacturer components can be detected so that these components can be eliminated from subsequent equipping or mounting procedures of the electrical assembly, such as a printer circuit board.

In an embodiment, the missing components can be identified by each of the successive component mounting units so that the missing component may then be mounted by one of the successive mounting units. As a result, the entire automated component mounting assembly line does not have to shut down when a component mounting unit does not have a component for mounting.

In an embodiment, a variety of mounting process inspection results are continuously stored during the mounting of components by each of the successive component mounting units. In this way, inspection results can be utilized by each of the successive component mounting units to ensure process quality control, such as, to avoid mounting components at faulty substrate cites or other like process control operations.

In a preferred embodiment, the communication or control unit is secured to a component mounting head member of the automatic component mounting unit. As a result, a variety of different substrate positions or cites can be optimally approached wherein the control unit can more effectively communicate with the substrate data storage units, particularly where the range of the data transmission is rather small.

In a preferred embodiment, the communication or control unit includes a separate read out unit and write unit. As a result, the stored process data can be read as soon as the substrate data storage units enter the component mounting process area along the conveying path of a conveyor. In this way, the stored process data of a previous mounting process or processes can be utilized in each of the subsequent or successive process or processes. In addition, new process data that is generated in each of the successive mounting processes can then be stored and subsequently utilized as previously discussed.

DESCRIPTION OF THE PREFERRED EMBODIMENTS

Figure 1:
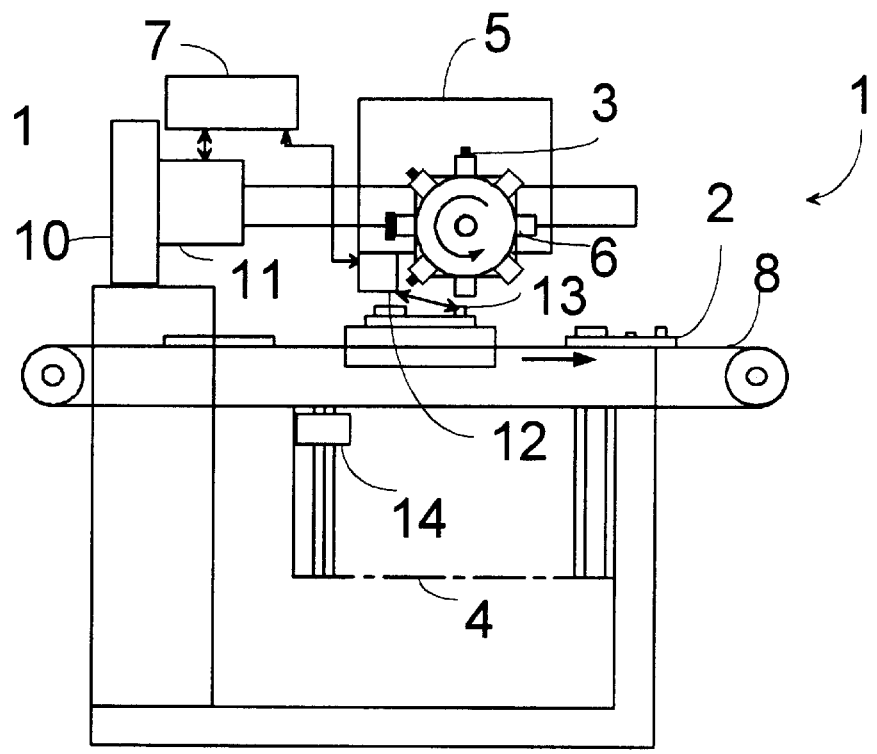
FIG. 1 is a schematic side view of an automatic component mounting unit that has a control unit which is positioned at the component mounting head.

FIG. 1 shows a schematic side view of an automatic component mounting unit 1 that utilizes a delivery member 4 and a mounting head member 5 to mount of a component 3 onto a substrate 2 of an electrical assembly. However, the present invention is not limited to the mounting of a single component onto a single substrate, but rather, applies to the mounting of a number of components 3 onto a number of substrates 2 wherein the components 3 and substrates 2 include a variety of different shapes, sizes, structures or other known properties.

Initially, the components 3 are fed to the component mounting head member 5 via the delivery member 4. The component mounting head member 5 includes a number of holding devices 6 for placing or mounting the component 3 onto the substrate 2. The holding devices 6 includes a suction pipette or other like holding device. The substrate 2 moves along a conveyor 8 in order to position the substrate 2 for accepting the component 3 from the component mounting head member 5. However, the present invention is not limited by the number, type, structure or other known characteristic of the component mounting head member 5.

The automatic component mounting unit 1 also includes a control mechanism or unit 7 that controls both the movement of the conveyor 8 as it moves along a conveying path to each of the successive automatic component mounting units 1 that are arranged in an assembly line manner and the movement of the component mounting head member 5 to a positioning mechanism 11. The position mechanism 11 is disposed on a frame 10 of the component mounting unit 1. It includes a number of movable carriages. The movable carriages move the component mounting head member 5 in a direction for receiving components from the delivery member 4 and then subsequently placing or mounting the components 3 onto the substrate 2.

The automatic component mounting unit 1 further includes a control unit 7 that communicates with a communication unit 12 The communication unit 12 is disposed onto the component mounting head member 5 for transmitting data between a data storage or transponder unit 13 that is disposed onto the substrate 2. In this way, the control unit 7 communicates with the data storage unit 13 via the communication unit 12 so that the control unit 7 can utilize the mounting process data or information that is stored within the data storage unit 13. The process data includes detailed mounting process information that was stored prior to the mounting process, such as, the component manufacturer identification codes of the components that are equipped or to be equipped onto the substrate or other like process information. The data storage unit 13 of the substrate 2 provides detailed process information that can be readily transmitted, processed or utilized in other like manners during the component mounting process in order to ensure optimal quality control and thus, optimal mounting process operation. In addition, the process information, such as, the component manufacturing information, can be utilized for addressing potential liability issues due to a faulty manufacturer component.

The present invention is not limited to a single data storage unit 13 that is disposed onto a substrate 2, but rather, the present invention applies to a number of data storage units 13 that can be disposed onto a substrate 2. The substrate 2 is equipped with the data storage unit 13 prior to the mounting process. However, the data storage unit 13 can also be mounted onto the substrate 2 by the automatic component mounting unit 1 similar to the mounting of the components 3. In this way, the component mounting head member 5 receives the data storage unit 13 onto the substrate 2. The data storage unit 13, line the component 3, are adhesively secured to the substrate 2 or secured in a like manner.

Figure 2:
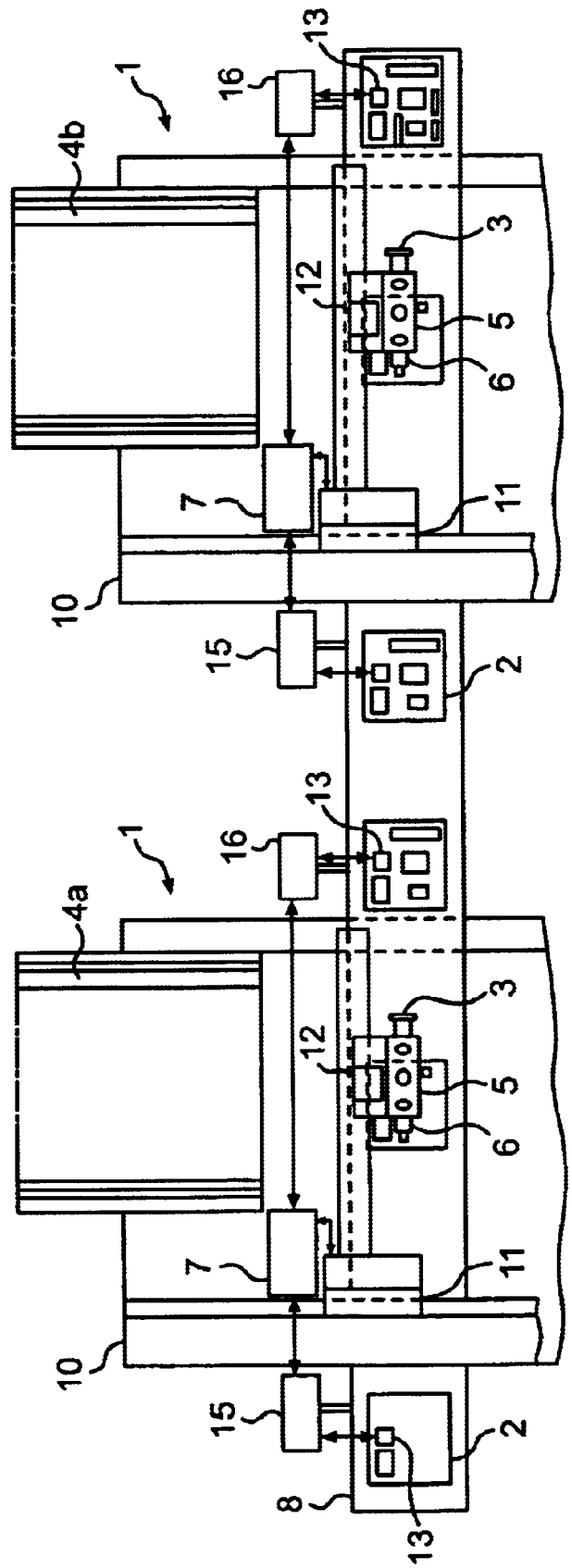
FIG. 2 is a schematic plan view of two automatic component mounting units that are arranged in succession in an assembly line manner wherein both of the component mounting units have a respective write and read unit that are arranged at the start and at the end of the conveying path.

In FIG. 2, the present invention is depicted in an assembly line manner wherein a first automatic component mounting unit 4a and a second automatic component unit 4b are arranged in succession along the conveyor 8. In this way, both of the first 4a and second 4b component mounting units have a respective conveying path on the conveyor 8 wherein the components 3 are mounted onto the substrate 2.

At the beginning and end of the respective conveying paths for both of the first 4a and second 4b component mounting units, a readout 15 and write 16 unit is included. In this way, the process data of the data storage unit 13 is utilized during the entire mounting process for both of the first 4a and second 4b component mounting units. In addition, the newly generated and stored process data from the first mounting unit 4a can then be utilized by the second mounting process unit 4b or any other subsequent mounting process unit (not shown) that is arranged along the conveyor 8. The data storage unit 13 transmits the data that was obtained from the first component mounting unit 4a to the readout unit 15 of the second component mounting unit 4b where it can then be desirably transmitted to the control unit 7 even before the mounting process begins. As a result, the control unit 7 has time to effectively evaluate the process data and to make any process control adjustment, if necessary, in order to ensure optimal quality control and process operation.

For example, any missing components data from the first component mounting unit 4a can be communicated to the second component mounting unit 4b so that the control unit 7 of the second mounting unit 4b can timely and effectively evaluate and respond to the missing component data. In this way, the control unit 7 can optimally control the second mounting unit 4b operation to mount the missing component onto the substrate provided that the second mounting unit 4b has been supplied with the missing component. If the second mounting unit 4b is unable to provide the missing component, this information can then be communicated to each of the successive component mounting units until the missing component is finally mounted.

In addition, the faulty substrate position information, like the missing component information, can be effectively and timely communicated from the first mounting unit 4a to the second 4b and other successive mounting units so that the second 4b or other successive mounting units can then optimally function to fix the faulty position or to avoid the faulty cites all together. Moreover, once the mounting process is complete, stored data of the data storage units 13 of the substrate 2 can be read or utilized to provide information regarding each stage of the assembly mounting process in order to further ensure and enhance quality control measures during future component mounting processes. However, the present invention is not limited by the type of process data or information and the ways in which this process data can be utilized to ensure process quality control and thus, to facilitate optimal component mounting process operations.

Figure 3:
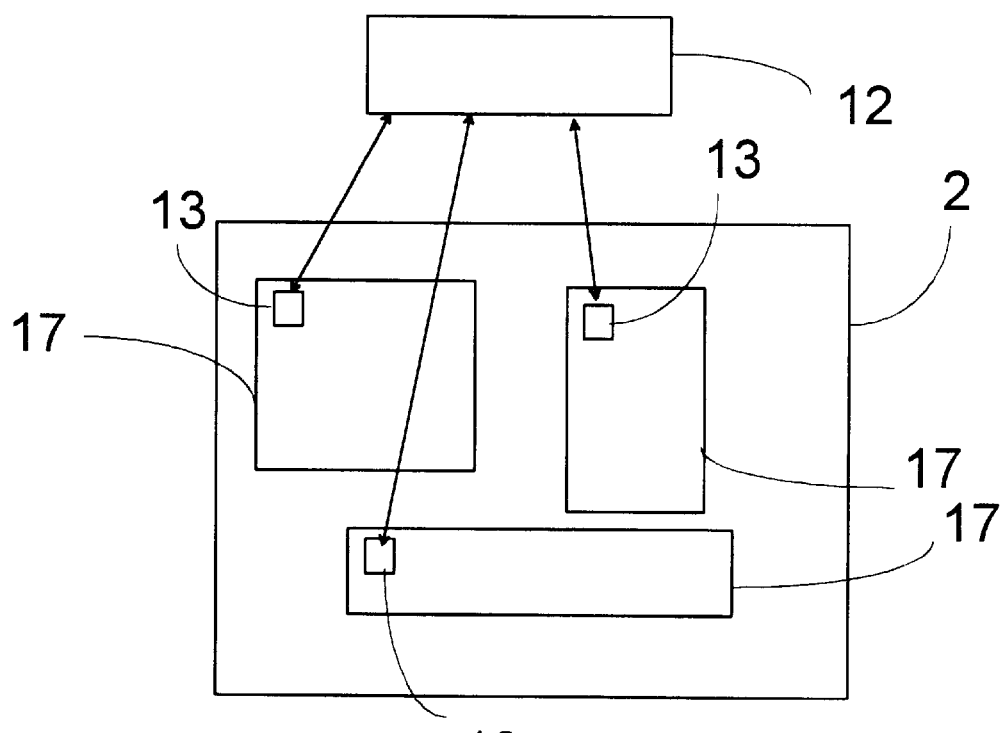
FIG. 3 is a schematic plan view of a substrate that is divided into a number of substrate regions wherein a data storage unit is disposed on each of the substrate regions.

In FIG. 3, the substrate 2 is divided into a number of substrate regions 17 in order to more precisely locate the faulty substrate cites or positions. Within each of the substrate regions 17, a data storage unit 13 is located that records and transmits process data which is specific to that substrate region 17. The stored process data of each of the substrate regions 17 can then be read or transmitted to a separate readout unit 12. The readout unit 12 acts independently from the automatic component mounting unit 1 to obtain mounting process data.

The present invention thus provides the ability to continually store detailed and precise data regarding the component mounting process of each individual substrate. As a result, the data can be utilized to monitor a variety of different component mounting parameters in order to ensure process quality control and thus, optimal component mounting process operation.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for mounting a component onto a printed circuit board of an electrical assembly comprising the steps of:
   providing an automatic component mounting unit, said automatic component mounting unit including a component mounting head member, a mounting control member, a mounting communication member and a mounting readout member;
   providing a data storage unit that is disposed on said printed circuit board;
   transporting said component to a predetermined position of said printed circuit board by moving said component mounting head member wherein said mounting control member controls said component onto said predetermined position by moving said component mounting head member wherein said mounting control member controls said mounting of said component;
   transmitting an amount of mounting process data from said mounting control member to said data storage unit via said mounting communication member;
   storing said amount of mounting process data within said data storage unit;
   transmitting said amount of mounting process data from said data storage unit to said mounting readout member wherein said amount of mounting process data is utilized during said mounting of said component.

2. A method according to claim 1, further comprising the steps of providing said automatic component mounting unit with a mounting magazine for supplying said automatic component mounting unit with a mounting magazine for supplying said automatic component mounting unit with a data storage unit and mounting said data storage unit onto said printed circuit board by moving said component mounting head member.

3. A method according to claim 1, further comprising the steps of providing a plurality of automatic component mounting units that are successively arranged in an assembly line manner wherein each of said automatic component mounting units that are successively arranged in an assembly line manner wherein each of said automatic component mounting units comprises a respective component mounting head member, a mounting control member, a mounting communication member and a mounting readout member,
   generating an amount of mounting process data at each of said automatic component mounting units during said mounting of said component and
   transmitting said amount of mounting process data to said data storage unit from said mounting control member via said mounting communication member for storing said amount of mounting process data that was generated at each of said automatic component mounting units during said mounting of said component.

4. A method according to claim 3, further comprising the steps of transmitting an amount of mounting process data from said data storage unit to said mounting communication member prior to said mounting of said component wherein said amount of mounting process data is then transmitted to and utilized by said mounting control member during said mounting of said component.

5. A method according to claim 1 wherein said printed circuit board further comprises a plurality of regions that each include a respective data storage unit and wherein each of said data storage units contains an amount of mounting process data that is specific to said respective region.

6. A method according to claim 1 wherein said amount of mounting process data comprises component manufacturer identification codes.

7. A method according to claim 1 wherein said amount of mounting process data comprises missing component information.

8. A method according to claim 1 wherein said amount of mounting process data comprises component inspection results.

9. A manufacturing method comprising:
   transporting a component, via a component mounting head member of a component mounting unit, to a position on a printed circuit board, wherein the component mounting unit includes a communication member for communicating with a data storage unit disposed on the printed circuit board;
   mounting the component on the printed circuit board; and
   communicating information related to the mounting of the component, between the data storage unit and the communication member and between the communication member and the data storage unit, wherein the information related to the mounting of the component is transmitted for storage in the data storage unit.

10. The manufacturing method of claim 9, wherein the information related to the mounting of the component is received by the communication member prior to mounting the component on the printed circuit board.

11. The manufacturing method of claim 9, further comprising:
    transporting the printed circuit board to another component mounting unit; and
    transmitting information stored in the data storage unit to a communication member of the another component mounting unit prior to mounting another component on the printed circuit board.

12. The manufacturing method of claim 9, wherein stored information is maintained in the data storage unit attached to the printed circuit board.

13. The manufacturing method of claim 9, wherein each of a plurality of data storage units are attached to various regions of the printed circuit board.

14. The manufacturing method of claim 9, wherein mounting process information is stored in the data storage unit.

15. The manufacturing method of claim 14, further comprising:
    transporting the printed circuit board to another component mounting unit; and
    transmitting information stored in the data storage unit to a communication member of the another component mounting unit prior to mounting another component on the printed circuit board.

* * * * *